(12) United States Patent
Kuo et al.

(10) Patent No.: US 9,966,168 B1
(45) Date of Patent: May 8, 2018

(54) METHOD OF FABRICATING CONDUCTIVE THIN FILM

(71) Applicant: NATIONAL CHENG KUNG UNIVERSITY, Tainan (TW)

(72) Inventors: Chang-Shu Kuo, Tainan (TW); In-Gann Chen, Tainan (TW); Hung-Tao Chen, Tainan (TW); Han-Hsuan Cheng, Tainan (TW)

(73) Assignee: NATIONAL CHENG KUNG UNIVERSITY, Tainani (TW)

( * ) Notice: Subject to any disclaimer, the term of this patent is extended or adjusted under 35 U.S.C. 154(b) by 0 days. days.

(21) Appl. No.: 15/391,839

(22) Filed: Dec. 28, 2016

(51) Int. Cl.
*H01B 13/00* (2006.01)
*B22F 1/02* (2006.01)
(Continued)

(52) U.S. Cl.
CPC ......... *H01B 13/0036* (2013.01); *B22F 1/004* (2013.01); *B22F 1/0044* (2013.01); *B22F 1/025* (2013.01); *B22F 9/22* (2013.01); *C22B 5/02* (2013.01); *C22B 11/02* (2013.01); *C22B 15/00* (2013.01); *H01J 37/32009* (2013.01); *B22F 2202/13* (2013.01); *B22F 2301/10* (2013.01); *B22F 2301/255* (2013.01);
(Continued)

(58) Field of Classification Search
CPC ..... H01B 13/0036; C22B 11/02; C22B 15/00; C22B 5/02; D04H 1/541; D04H 1/728; B44C 1/227; D06M 11/01; D06M 11/34; D06M 10/02; C09K 13/00; Y10T 442/614; Y10T 442/655; Y10T 442/109; B82Y 40/00; D01D 5/0007; D01D 5/11; B22F 2301/10; B22F 2998/10; B22F 1/025; B22F 1/004; B22F 2301/255; B22F 2302/45; B22F 2202/13; B22F 1/0044; B22F 9/22; H01J 2237/334; H01J 37/32009
See application file for complete search history.

(56) References Cited

U.S. PATENT DOCUMENTS 7,981,354 B2 7/2011 Wendorff
8,906,447 B2 12/2014 Zhamu
(Continued)

FOREIGN PATENT DOCUMENTS

TW I538753 B 6/2016

OTHER PUBLICATIONS

Abstract of CN103705969 A, Apr. 9, 2014, "Manufacture of chitosan-based silver-loaded composite superfine fibrous membrane used in medical dressing field, involves spinning silver-containing chitosan/polyethylene oxide or polyethylene alcohol blend liquid and drying", Cheng, F. (Year: 2014).*
(Continued)

*Primary Examiner* — Anita K Alanko
(74) *Attorney, Agent, or Firm* — Raymond Y. Chan; David and Raymond Patent Firm

(57) ABSTRACT

A method of fabricating a conductive thin film includes the following steps: forming a polymer fiber made of a polymer and a metal precursor distributed in a surface layer near the surface of the polymer fiber; and applying a plasma treatment on the polymer fiber to concurrently etch the polymer and reduce the metal precursor in the surface layer of the polymer fiber. When the plasma treatment is completed, a metal membrane is formed on the surface of the polymer fiber.

20 Claims, 13 Drawing Sheets

(51) Int. Cl.
*B22F 1/00* (2006.01)
*H01J 37/32* (2006.01)
*C22B 11/02* (2006.01)
*B22F 9/22* (2006.01)
*C22B 15/00* (2006.01)
*C22B 5/02* (2006.01)
*D04H 1/541* (2012.01)
*D01D 5/11* (2006.01)
*B44C 1/22* (2006.01)
*D06M 11/01* (2006.01)
*D06M 11/34* (2006.01)
*C09K 13/00* (2006.01)
*B82Y 40/00* (2011.01)
*D04H 1/728* (2012.01)
*D01D 5/00* (2006.01)
*D06M 10/02* (2006.01)

(52) U.S. Cl.
CPC ....... *B22F 2302/45* (2013.01); *B22F 2998/10* (2013.01); *B44C 1/227* (2013.01); *B82Y 40/00* (2013.01); *C09K 13/00* (2013.01); *D01D 5/0007* (2013.01); *D01D 5/11* (2013.01); *D04H 1/541* (2013.01); *D04H 1/728* (2013.01); *D06M 10/02* (2013.01); *D06M 11/01* (2013.01); *D06M 11/34* (2013.01); *H01J 2237/334* (2013.01); *Y10T 442/109* (2015.04); *Y10T 442/614* (2015.04); *Y10T 442/655* (2015.04)

(56) References Cited

U.S. PATENT DOCUMENTS

| | | | |
|---|---|---|---|
| 9,506,148 B2 | 11/2016 | Chen et al. | |
| 2004/0067358 A1* | 4/2004 | Kim | D01D 5/003 428/375 |
| 2009/0148701 A1* | 6/2009 | Wendorff | C04B 35/62254 428/401 |
| 2011/0300347 A1* | 12/2011 | Yoon | D04H 1/728 428/195.1 |
| 2013/0042911 A1 | 2/2013 | Jung | |
| 2013/0266943 A1* | 10/2013 | Powell | G01N 1/34 435/6.11 |
| 2015/0235731 A1* | 8/2015 | Park | H01B 1/22 252/514 |
| 2016/0166959 A1* | 6/2016 | Cui | B01D 39/08 95/57 |

OTHER PUBLICATIONS

Abstract of CN 104451955, Mar. 25, 2015, "Preparing metal or metal oxide hierarchical structure comprises preparing polymer solution, carrying out electrostatic spinning, etching fiber surface, obtaining fiber template, sputtering metal or metal oxide and high temperature annealing," Fan, X et al. (Year: 2015).*

Plasma Synthesized Silver Nanoparticles on Electrospun Chitosan Nanofiber Surfaces for Antibacterial Applications, Biomacromolecules, 16(10), 3248, 2015.

* cited by examiner

PET/Au core-sheath fibers

PMMA/Cu core-sheath fibers

METHOD OF FABRICATING CONDUCTIVE THIN FILM

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates generally to the field of fabricating a conductive thin film, and more particularly to a method of fabricating a conductive thin film made of a polymer fiber and a conductive metal.

Description of Related Arts

Indium tin oxide (ITO) transparent conductive films have been widely adopted in flat panel displays or optoelectronic devices due to their intrinsic properties of high conductivity and good light transmittance. However, engineers in the related field are still making lots of efforts to seek replacements for the ITO films because of their relatively high costs and poor mechanical properties.

Currently, with the advance of the electrospinning techniques, some manufacturers have adopted an electrospinning process and an electroless plating process to fabricate transparent conductive polymer films. Generally, the fabricating process includes at least the following steps of: applying an electrospinning process to fabricate tangled electrospun polymer fibers, and then applying an electroless plating process to plate a metal membrane on the surface of the electrospun polymer fibers. Additionally, in order to facilitate the electroless plating process, a metal-containing seed layer must be coated on the surface of the electrospun polymer fibers in advance. For example, a 12-hr pre-treatment process, such as a heat treatment process may be carried out to fabricate the metal-containing seed layer.

Since the pre-treatment process needs a long processing time, i.e. 12 hours, the whole process for fabricating the transparent conductive polymer film is time-consuming. Besides, impurities are often inevitably produced in the electrospun polymer fibers or in the metal membrane over the surface of the electrospun polymer fibers because the reduction process for forming the metal membrane is usually carried out in liquid environment.

SUMMARY OF THE PRESENT INVENTION

In light of the above, a method of fabricating a conductive thin film is disclosed in accordance with the embodiments of the present invention and may successfully overcome the technical drawbacks in the convention technique.

According to one embodiment of the invention, a method of fabricating a conductive thin film is disclosed and includes the following steps: forming a polymer fiber made of a polymer and a metal precursor distributed in a surface layer near the surface of the polymer fiber; and applying a plasma treatment on the polymer fiber to concurrently etch the polymer and reduce the metal precursor in the surface layer of the polymer fiber. When the plasma treatment is completed, a metal membrane is formed on the surface of the polymer fiber.

Since the metal precursor in the surface layer of the polymer fiber is reduced to metal in a gas environment, there are only few impurities in the corresponding metal membrane when the whole process is completed. Besides, the method above is also more time-efficient than convention method because the plasma treatment process may be completed in a short time, for example, less than 30 minutes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

For more complete understanding of the embodiments of the present invention and their advantage, reference is now made to the following description, taken in conjunction with accompanying drawings, in which.

DETAILED DESCRIPTION OF THE PREFERRED EMBODIMENT

Figure 1:
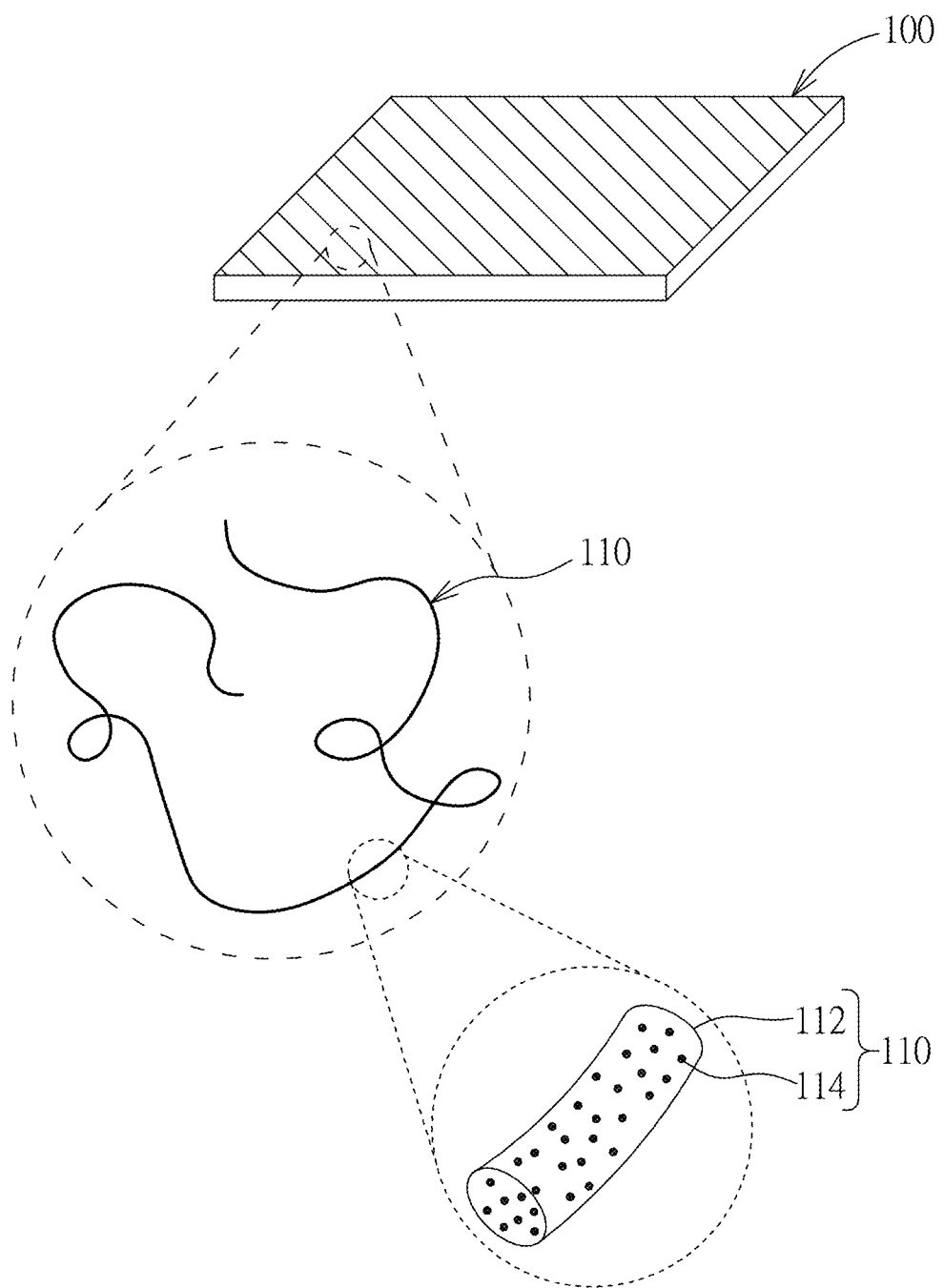
FIG. 1 is a schematic diagram of a fibrous web structure in accordance with one embodiment of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of components and regions may be exaggerated for clarity unless express so defined herein.

The terminology used herein is for the purpose of describing particular embodiments only and is not intended to be limiting. As used herein, the singular terms "a", "an," and "the" may be intended to include the plural forms as well, unless the context clearly indicates otherwise. The terms "comprises," "comprising," "includes" and/or "including" are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the following paragraphs, a method of fabricating a conductive thin film is disclosed in detail.

FIG. 1 is a schematic diagram of a fibrous web structure in accordance with one embodiment of the present invention. The fibrous web structure 100 shown in FIG. 1 is a thin film made of one or more severed tangled polymer fibers 110 which are stacked over one another. The polymer fiber 110 may be made of a polymer 112 and a metal precursor 114. The metal precursor 114 may be uniformly distributed in the polymer fiber 110 to have a uniform concentration, or the amount of the metal precursor 114 may be gradually reduced from the surface to the core of the polymer fiber 110 so as to create concentration gradients in a radial direction of the polymer fiber 110.

Preferably, the polymer 112 may be a homopolymer or a copolymer and may be selected from the group consisting of acrylic-based polymer, vinyl-based polymer, polyester, and polyamide, but not limited thereto. Preferably, the acrylic-based polymer may be polymethylmethacrylate (PMMA), $(C_5O_2H_8)_n$, polyacrylonitrile (PAN) or the like, the vinyl-based polymer may be polystyrene, polyvinyl acetate (PVAc) or the like, the polyester may be polycarbonate, polyethylene terephthalate (PET) or the like, and the polyamide may be nylon, but is not limited thereto.

The metal precursor 114 may be a metal ion-containing precursor, it may be selected from the group consisting of a metal salt, a metal halide, an organometallic complex, and a metallic nanoparticle encapsulated in protection agents, but not limited thereto. The metal ion in the metal precursor 114 is preferably selected from the group consisting of gold ions, silver ions, copper ions and platinum ions, but is not limited thereto. Preferably, the metal salt may be selected from the group consisting of silver trifluoroacetate ($CF_3COOAg$), silver acetate ($CH_3COOAg$), silver nitrate ($AgNO_3$), copper acetate [$Cu(COOCH_3)_2$], copper hydroxide [$(Cu(OH)_2$], copper nitrate [$(Cu(NO_3)_2$], copper sulfide ($CuSO_4$), and sodium hexahydroxyplatinate [$Na_2Pt(OH)_6$], but not limited thereto. The metal halide may be selected from the group consisting of silver chloride (AgCl), silver iodide (AgI), gold(III) chloride, chloroauric acid ($HAuCl_4 \cdot 3H_2O$), and copper chloride ($CuCl_2$), but not limited thereto. The organometallic complex may be copper phthalocyanine, but not limited thereto. For the metallic nanoparticle encapsulated in the protection agents, the protection agents may be selected from the group consisting of a thiol, a carboxylic acid, an amine, and a ligand. The composition of the metal nanoparticle may include gold, silver, copper and/or platinum, but not limited thereto.

Figure 2:
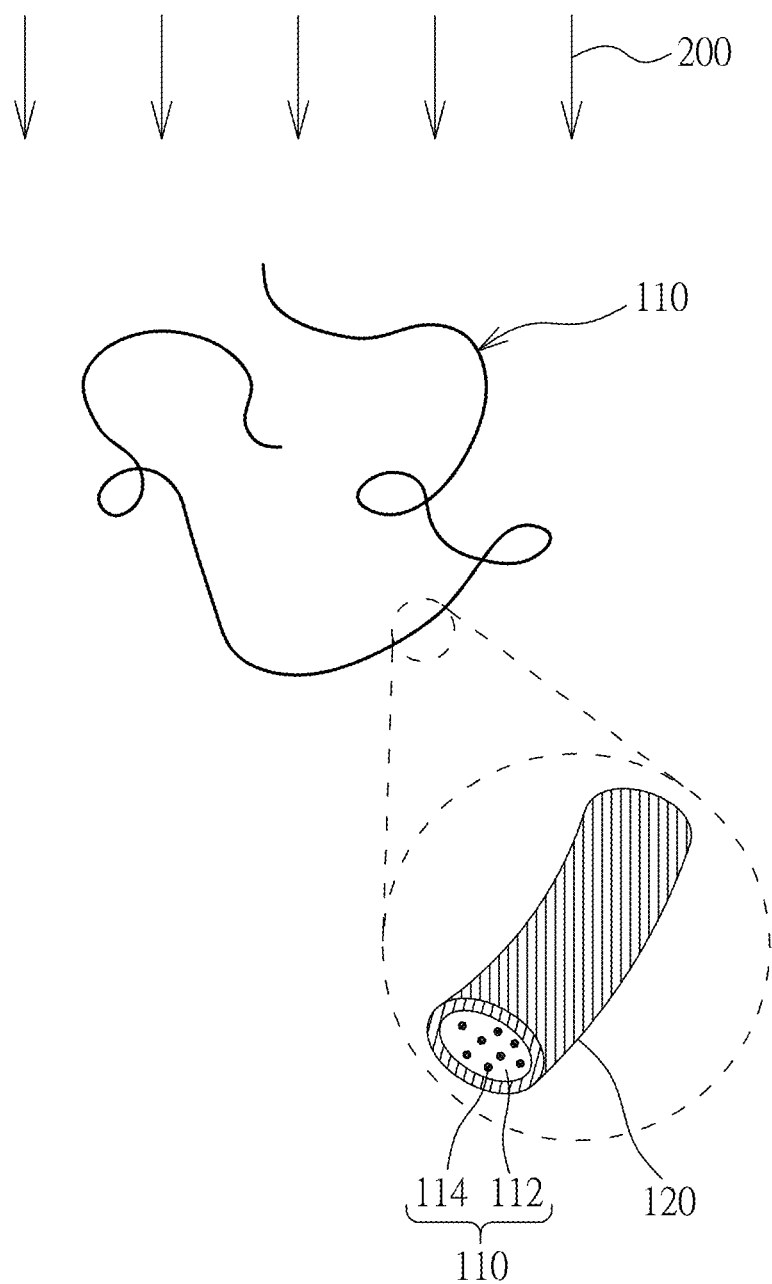
FIG. 2 is a schematic diagram of a core-sheath fiber in accordance with one embodiment of the present invention.

FIG. 2 is a schematic diagram of a core-sheath fiber in accordance with one embodiment of the present invention. A plasma treatment process 200 is applied to the polymer fiber 110 to concurrently etch the polymer 112 in the polymer fiber 110 and reduce the metal precursor 114, especially the metal precursor 114 in a surface layer of polymer fiber 110, so as to form a metal membrane 120 on the surface layer of the polymer fiber 110. It should be noted that the surface layer disclosed herein represents a layer near the surface of the polymer fiber 110. When the plasma treatment process 200 is completed, at least portions of, preferably all the surface layer of the polymer fiber 110 are surrounded by the continuous metal membrane 120. Therefore, the inner polymer fiber 110 and the outer metal membrane 120 may constitute a core-sheath structure. Compared with the core-sheath structure fabricated by the conventional electroless plating process, the metal membrane 120 fabricated according to the embodiment of the present invention has only a trace of impurities since it is fabricated in a relatively clean gas-phase environment. In other words, in a condition where the metal membranes have the same thickness, the metal membrane 120 disclosed in the present embodiment may have relatively low sheet resistance compared with the metal membrane fabricated by the conventional process.

In detail, the polymer 112 inside the polymer fiber 110 is gradually etched away during the plasma treatment process 200, which leads to the decrease in the diameter of the polymer fiber 110. Meanwhile, the metal precursor 114 is reduced to metal, and the metal may accumulates on the surface layer of the polymer fiber 110 and constitute a continuous metal membrane 120. Since the metal membrane 120 obtained in the plasma treatment process 200 has an etch rate lower than that of the polymer 112, for example, the ratio of the etch rates of the two materials preferably ranges between 0~0.01, the polymer 112 covered by the metal membrane 120 may be protected during the plasma treatment process 200. In other words, the diameter of the polymer fiber 110 may be greater than a minimum value when the plasma treatment process 200 is completed. It should be noted that, in order to fabricate a continuous metal membrane with relatively low sheet resistance, the plasma treatment process 200 needs to be conducted for at least 20 minutes, preferably 30 minutes, but not limited thereto.

The plasma treatment process 200 may be a low-pressure or a high-pressure plasma treatment conducted in a vacuum chamber, or it may be an atmospheric-pressure plasma treatment conducted without a vacuum chamber. In addition, gas ingredients used in the plasma treatment process 200 may includes inert gas, air, oxygen, and/or hydrogen, but is not limited thereto. For a case where the plasma treatment process 200 is conducted in a vacuum chamber, when there is solvent, such as organic solvent, remaining inside the polymer fiber 200 before the plasma treatment process 200, the solvent should be removed in advance so as to prevent the solvent from contaminating the vacuum chamber.

When the plasma treatment process 200 is completed, traces of the metal precursor 114 may remain in the polymer fiber 110. In order to completely remove the remaining metal precursor 114, an optional cleaning process may be carried out and applied onto the polymer fiber 110. In particular, referring to FIG. 3, a liquid-phase or a gas-phase cleaning process 300 may be carried out to obtain the polymer fiber 110 free of the metal precursor 114.

According to the embodiments disclosed above, the core-sheath structure made of the polymer fiber 110 and the metal membrane 120 may be fabricated by applying the plasma treatment process 200. The polymer fiber 110 may constitute a fibrous web which not only has a relatively high conductivity but also has excellent mechanical supporting ability, mechanical strength, flexibility, and gas permeability.

The process used to fabricate the polymer fiber 110 may be an electrospinning process, an electrospray process, a melt blown process, a flash spinning process or an electrostatic melt blown process, but not limited thereto. In the following paragraphs, an exemplary method of fabricating a polymer fiber by the electrospinning process is disclosed in detail.

Figure 4:
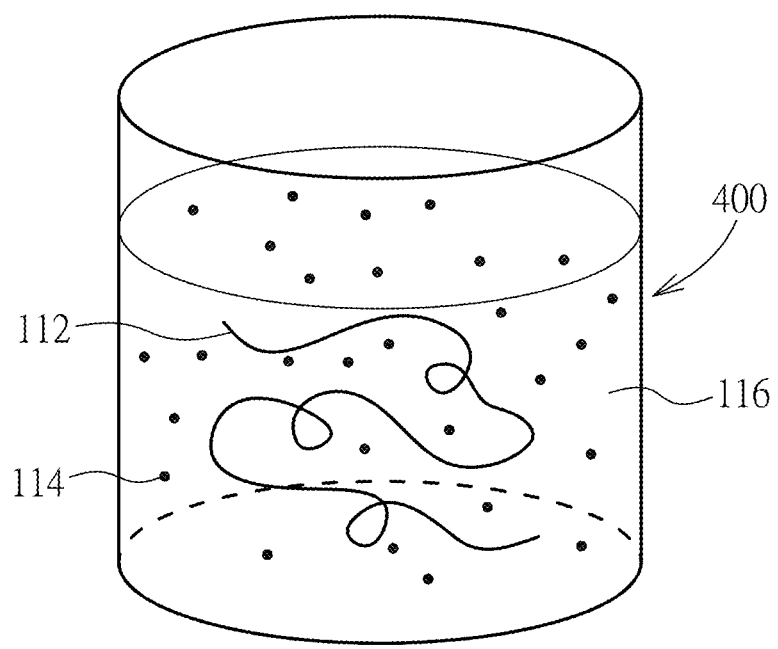
FIG. 4 is a schematic diagram of a beaker filled with a polymer solution in accordance with one embodiment of the present invention polymer solution.

FIG. 4 is a schematic diagram of a beaker filled with a polymer solution in accordance with one embodiment of the present invention polymer solution. The solution 400 is made of at least a polymer 112, a metal precursor 114, and an organic solvent 116, and the ingredients may be used as material for electrospinning fibers. The polymer 112 and the metal precursor 114 may be selected from the polymer and the metal precursor described in the preceding embodiment. Furthermore, the polymer 112 is preferably selected from a polymer with relatively high mechanical strength and flexibility, such as PMMA, PET or PBT. In order to prepare the solution 400 with a high metal precursor concentration, such as greater than 10 wt %, the metal precursor 114 is preferably selected from a metal precursor with high solubility in organic solvent. In this way, the metal membrane fabricated in the subsequent processes may be uniformly distributed on and entirely surround the surface layer of the polymer fiber. For example, when the polymer 112 is poly(methyl methacrylate), and the metal precursor 114 is silver trifluoroacetate, a weight percent of poly(methyl methacrylate) in the solution preferably ranges from 10~20 wt % based on the total weight of the solution 400, and a weight ratio of silver trifluoroacetate to poly(methyl methacrylate) is preferably 0.2~1.5. In another example, when the polymer 112 is polyethylene terephthalate, and the metal precursor 114 is silver trifluoroacetate, a weight percent of polyethylene terephthalate in the solution preferably ranges from 5~20 wt % based on the total weight of the solution 400, and a weight ratio of silver trifluoroacetate to polyethylene terephthalate is preferably 0.2~1.5.

According to some examples of the present invention, the specific components of the solution 400 are listed in Table 1, where MEK represents butanone, MeOH represents methanol, TAF represents silver trifluoroacetate ($CF_3COOH$), and DCM represents dichloromethane ($CH_2Cl_2$). $Ag^+$/polymer in Table 1 represents a weight ratio of the metal ions of a metal precursor to a polymer.

TABLE 1

| Examples | Metal precursor | Polymer | Solvent | Polymer (prior to adding Metal metal precursor) | Metal precursor |
|---|---|---|---|---|---|
| Example 1 | silver trifluoroacetate | PMMA | MEK/ MeOH = 2:1 | 15 wt % | 13.3 wt % ($Ag^+$/polymer = 0.5) |
| Example 2 | silver trifluoroacetate | PET | TFA/ DCM = 4:1 | 11 wt % | 10.1 wt % ($Ag^+$/polymer = 0.5) |

Figure 5:
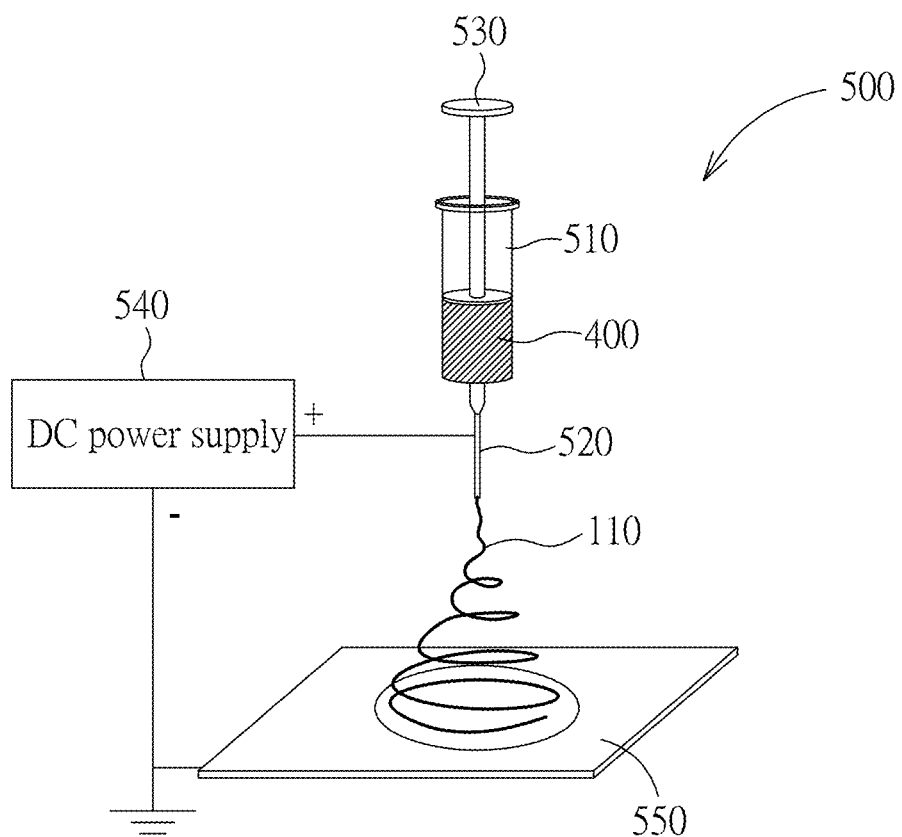
FIG. 5 is a schematic diagram of applying an electrospinning process in accordance with one embodiment of the present invention.

FIG. 5 is a schematic diagram of applying an electrospinning process in accordance with one embodiment of the present invention. The solution 400 is then spun by an electrospinning process in order to fabricate the polymer fiber 110. Specifically, an electrospinning apparatus 400 shown in FIG. 5 is adopted in the electrospinning process and may include a reservoir 510, a spinneret 520 disposed at an distal end of the reservoir 510, a liquid displacement system 530 used to push the solution 400, a power supply 540 and a collector plate 550. The spinneret 520 may be a hypodermic syringe needle, and the liquid displacement system 530 may be connected to a syringe pump which is used to control the flow rate of the solution 400 within a desired range. The flow rate is preferably set between 0.1~100 μl/min. The positive electrode and the negative electrode of the power supply 540 are respectively connected to the spinneret 520 and the grounded collector plate 550. The voltage provided by the power supply 540 is preferably between 5~20 kV. As shown in FIG. 5, there is a spacing, preferably ranging between 5~20 cm, between the collector plate 550 and the spinneret 520. Thus, the electric filed created in the spacing may range from 0.2 kV/cm to 6 kV/cm.

Table 2 shows various parameters used in electrospinning processes and the diameters of the corresponding electrospun fiber in accordance with the embodiments of the present invention. It should be noted that the examples shown in Table 2 respectively correspond to the examples shown in Table 1. The spacing refers to the spacing between the collector plate and the spinneret.

TABLE 2

| Examples | Polymer | Voltage (kV) | Rate (μl/min) | Spacing (cm) | Diameter (nm) |
|---|---|---|---|---|---|
| Example 1 | PMMA | 10 | 10 | 10 | 680 |
| Example 2 | PET | 20 | 4 | 15 | 270 |

Table 3 shows the changes in the diameter of an electrospun fiber during a plasmas treatment process according to some examples of the invention. The examples shown in Table 3 respectively correspond to the examples shown in Table 2.

TABLE 3

| Examples | Polymer | Diameter before treatment (nm) | Diameter after treatment (nm) |
|---|---|---|---|
| Example 1 | PMMA | 680 | 400 |
| Example 2 | PET | 270 | 110 |

Figure 6:
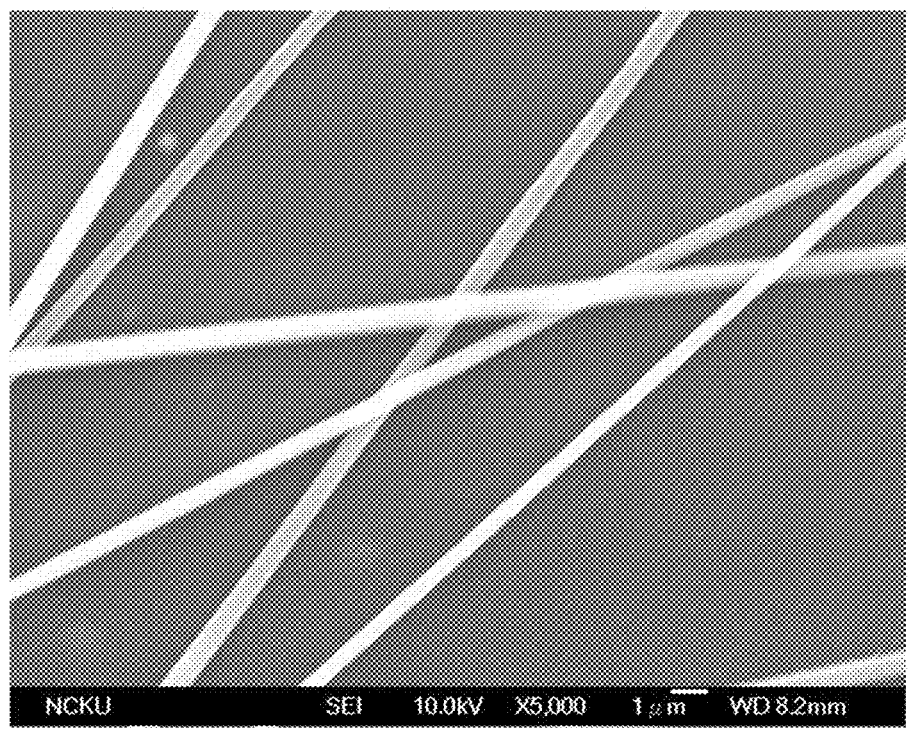
FIG. 6 is a scanning electron microscope (SEM) image of an electrospun fiber processed by a plasma treatment process in accordance with one embodiment of the present invention.

FIG. 6 is a scanning electron microscope (SEM) image of an electrospun fiber processed by a plasma treatment process in accordance with one embodiment of the present invention. The electrospun fiber shown in FIG. 6 is prepared and processed at the parameters of example 1 listed in Tables 1, 2 and 3. FIG. 6 clearly shows that the surface layer of the polymer fiber is surrounded by the metal membrane, and the polymer fiber still has a linear structure.

Figure 7:
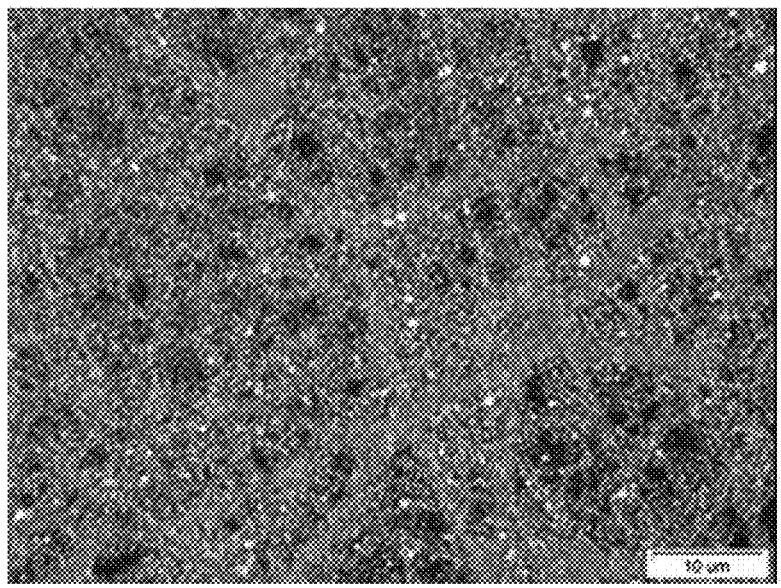
FIG. 7 is an optical microscope image of an electrospun fiber processed by a plasma treatment process in accordance with one embodiment of the present invention.
Figure 7:
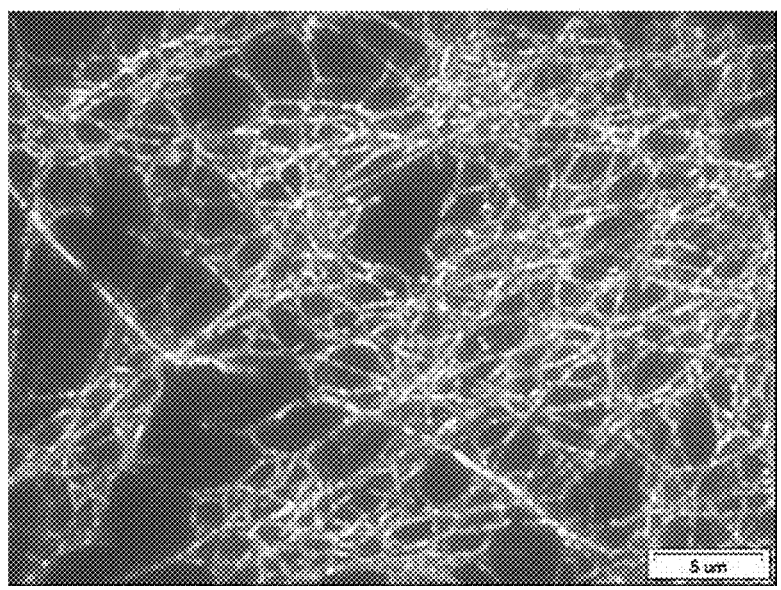

It should be noted that, in addition to the solution containing the silver-containing precursors, solutions containing gold-containing precursors or copper-containing precursors may also be treated with the electrospinning process and the plasma treatment process so as to obtained desired electrospun fibers. For instance, a solution containing gold(III) chloride trihydrate ($HAuCl_4 \cdot 3H_2O$) and PET, or a solution containing copper (II) chloride and PMMA, may be treated with an electrospinning process and a plasma treatment process similar to the processes described above so as to fabricate a core-sheath polymer fiber. The corresponding structure is shown in the optical microscope image of FIG. 7.

In addition, in order to find out the affect of the concentration of the metal precursor on the conductivity of the polymer fiber, polymer solutions with different silver-containing precursor concentrations are electrospun to form electrospun fibers and then processed by a plasma treatment process. The result is disclosed in the table below.

TABLE 4

|  | Example 1 | Example 2 | Example 3 | Example 4 | Example 5 |
|---|---|---|---|---|---|
| $Ag^+$/PMMA | 0.5 | 0.4 | 0.3 | 0.2 | 0.1 |
| Silver trifluoroacetate (wt %) | 13.3 | 10.9 | 8.4 | 5.8 | 3.0 |
| Diameter before treatment (nm) | 680 | 680 | 680 | 680 | 680 |
| Ingredients in plasma treatment | argon | argon | argon | argon | argon |
| Diameter after treatment (nm) | 400 | 400 | 400 | 400 | 400 |
| Thickness of silver membrane (nm) | 23.3 | 18.4 | 13.6 | 8.98 | 4.44 |
| Conductivity | conductive {Rs < 500(ohm/sq)} | conductive {Rs < 500(ohm/sq)} | conductive {Rs < 500(ohm/sq)} | high sheet resistance {Rs > 500(ohm/sq)} | Non-conductive |

Based on the results shown in Table 4, when the concentration of silver trifluoroacetate is greater than 5 wt % (corresponding to Examples 1, 2, 3 and 4), the corresponding fabricated electrospun fibers may have a relatively thick silver membrane and relatively high conductivity. Furthermore, when the concentration of silver trifluoroacetate is greater than 10 wt %, the corresponding fabricated electrospun fibers may have much higher conductivity. In contrast, when the concentration of silver trifluoroacetate is less than 5 wt % (corresponding to Example 5), the corresponding electrospun fibers may have a relatively thin silver membrane and thus a relatively low conductivity.

Figure 8:
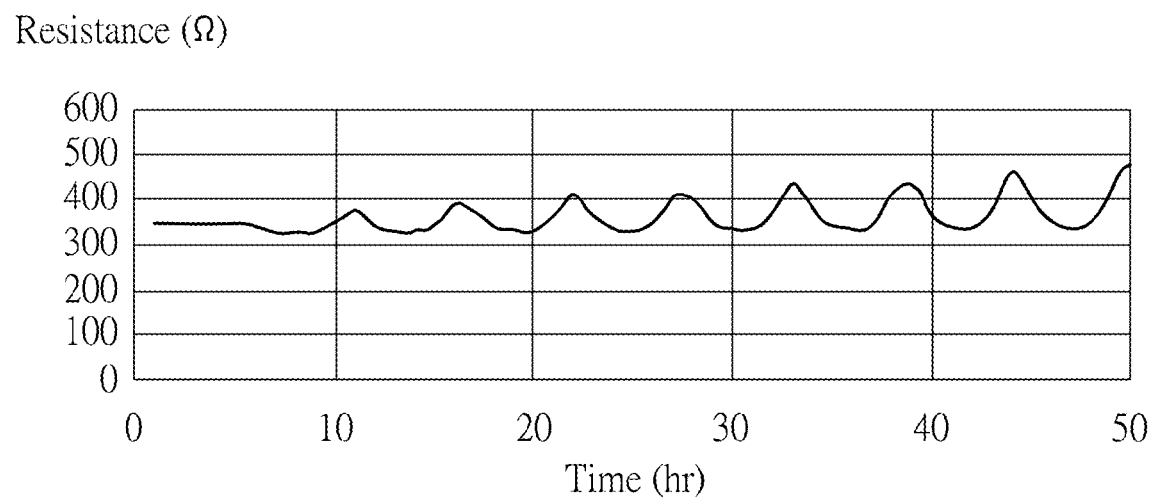
FIG. 8 is a plot of the electrical resistance of a fibrous web structure versus time in accordance with one embodiment of the present invention.

In order to testify the flexibility of the fibrous web structure, the polymer fiber (prepared and treated corresponding to Example 1 in Tables 1, 2, and 3) is electrospun onto a flexible transparent PET substrate and then loaded into a flexing machine. The specimen is then tested at a bending radius of 2 mm and a bending frequency of 0.85 Hz. During the test, the resistance across two ends of the fibrous web structure is measured in-situ so as to obtain a plot of the electrical resistance versus the time. The plot shown in FIG. 8 indicates that the resistance of the tested fibrous web structure increases only by 16% when the fibrous web structure is bended by 50 times.

It should be noted that, in addition to the monoaxial electrospinning process disclosed above, a coaxial electrospinning process may also be applied according to other embodiments of the invention. The coaxial electrospinning process is disclosed in detail in the following paragraphs.

Figure 9:
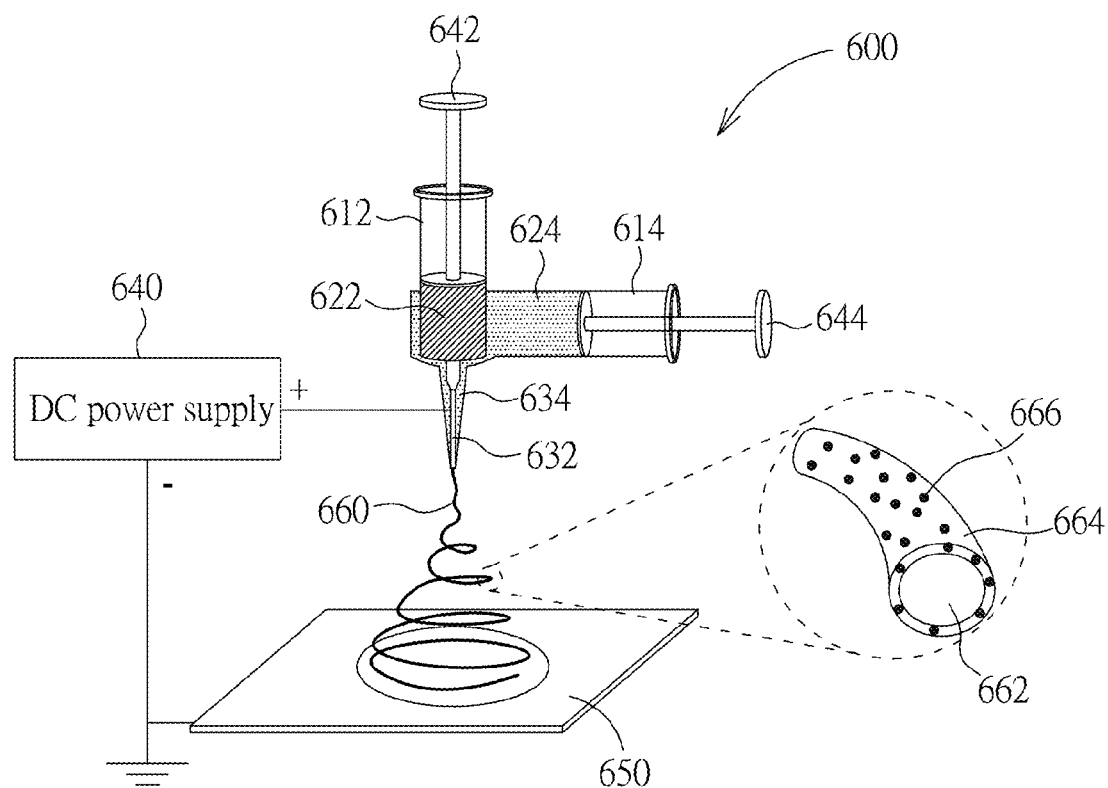
FIG. 9 is a schematic diagram of applying an electrospinning process in accordance with one embodiment of the present invention.

FIG. 9 is a schematic diagram of applying an electrospinning process in accordance with one embodiment of the present invention. The electrospinning apparatus 600 shown in FIG. 9 is similar to the electrospinning apparatus 500 shown in FIG. 5. The electrospinning apparatus 600 also includes a reservoir 612, a spinneret 632 disposed at a distal end of the reservoir 612, a liquid displacement system 642 used to push the solution 622, a power supply 640 and a collector plate 650. Since the parts of the electrospinning apparatus 600 are similar to the corresponding parts of the electrospinning apparatus 500 in the embodiment of FIG. 5, the detail description of which is therefore omitted. The electrospinning apparatus 600, however, further includes additional parts which are not included in the electrospinning apparatus 500 of FIG. 5. In detail, the electrospinning apparatus 600 further includes another reservoir 614, another spinneret 634 coaxially surrounding the spinneret 632, and another liquid displacement system 644 used to propel a solution 624. During the electrospinning process, the solution 622 and the solution 624 may be respectively propelled by the liquid displacement system 642 and the liquid displacement system 644, and then ejected from the spinneret 632 and the spinneret 634 so as to form a coaxial polymer fiber 660.

In accordance with one embodiment of the present invention, the solution 622 may be a polymer solution without any metal precursor, and the type of the polymer in the polymer solution may be chosen from the type of the polymer 112 disclosed in the embodiment of FIG. 1. The solution 624 is a polymer solution containing a metal precursor, and the types of the metal precursor and the polymer may be respectively chosen from the types of the metal precursor 114 and the polymer 112 disclosed in the embodiment of FIG. 1. The type of the polymer in the solution 624 is preferably different from that of the polymer in the solution 622.

An enlarged figure on the right side of FIG. 9 clearly shows the structure of the polymer fiber. The polymer fiber 660 is a double-layered structure made of a core 662 and a sheath 664. The type of the polymer in the core 662 corresponds to that of the polymer in the solution 622, while the type of the polymer in the sheath 664 corresponds to that of the polymer in the solution 624. For an electrospinning process using the solution 622 containing no metal precursor and the solution 624 containing the metal precursor 666, most of the metal precursor 666 may be in the sheath 664 of the polymer fiber 660, while none or merely a trace of the metal precursor 666 may be in the core 662 of the polymer fiber 660.

According to the embodiments of FIG. 5 and FIG. 9, the solution made of at least the metal precursor and the polymer is electrospun so as to fabricate the polymer fiber 110 and 660. It should be noted that the solution used in the electrospinning process may contain no metal precursor according other embodiments of the present invention. In other words, the metal precursor may diffuse into the surface layer of the polymer fiber by a suitable process, such as a spin coating process or a dip coating process, after the electrospinning process. The detailed description of which is disclosed below.

Figure 10:
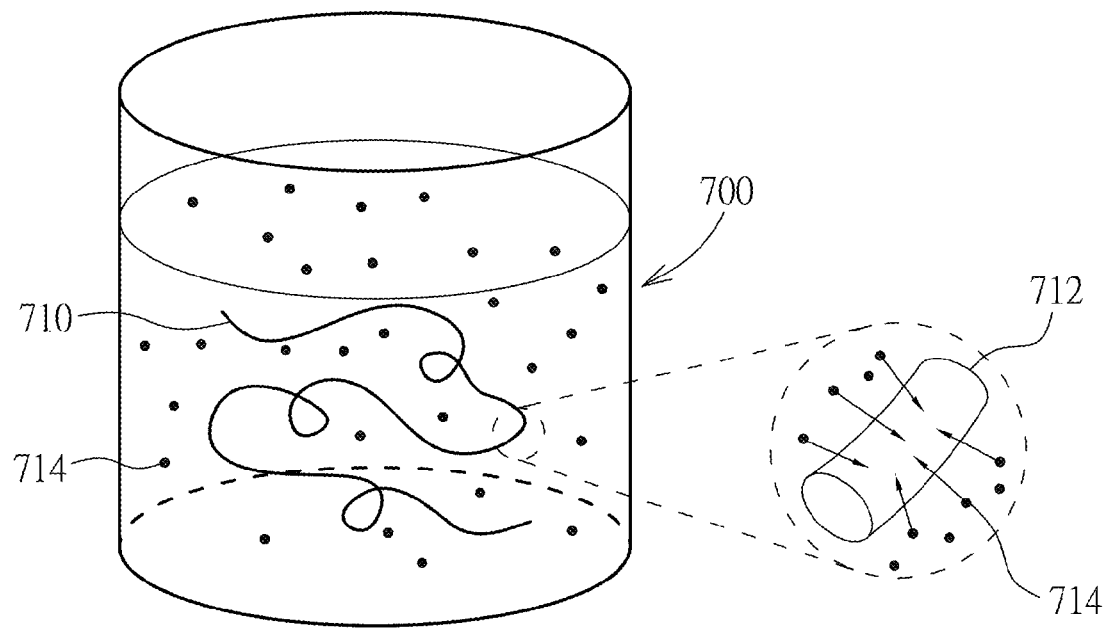
FIG. 10 is a schematic diagram of diffusing a metal precursor into a surface layer of a polymer fiber during a diffusion process in accordance with one embodiment of the present invention.

FIG. 10 is a schematic diagram of diffusing a metal precursor into a surface layer of a polymer fiber during a diffusion process in accordance with one embodiment of the present invention. According to the present embodiment, a polymer fiber 710 is mainly made of a polymer 712 when the electrospinning process is completed. That is to say, there is no metal precursor in the polymer fiber 710 at this time. Then, the polymer fiber 710 is dipped into a solution containing a metal precursor 714 to let the metal precursor 714 diffuse into the polymer fiber 710. Since the time at which the metal precursor 714 diffuses into the polymer fiber 710 is later than the time at which the polymer fiber 710 is fabricated, the concentration of the metal precursor 714 may be gradually reduced from the surface to the core of the polymer fiber 710. Therefore, concentration gradients may be created in the polymer fiber 710. It should be noted that the polymer fiber 710 dipped in the solution is preferably tangled and tightly stacked to be a web thin film rather than loosely distributed in the solution.

Figure 3:
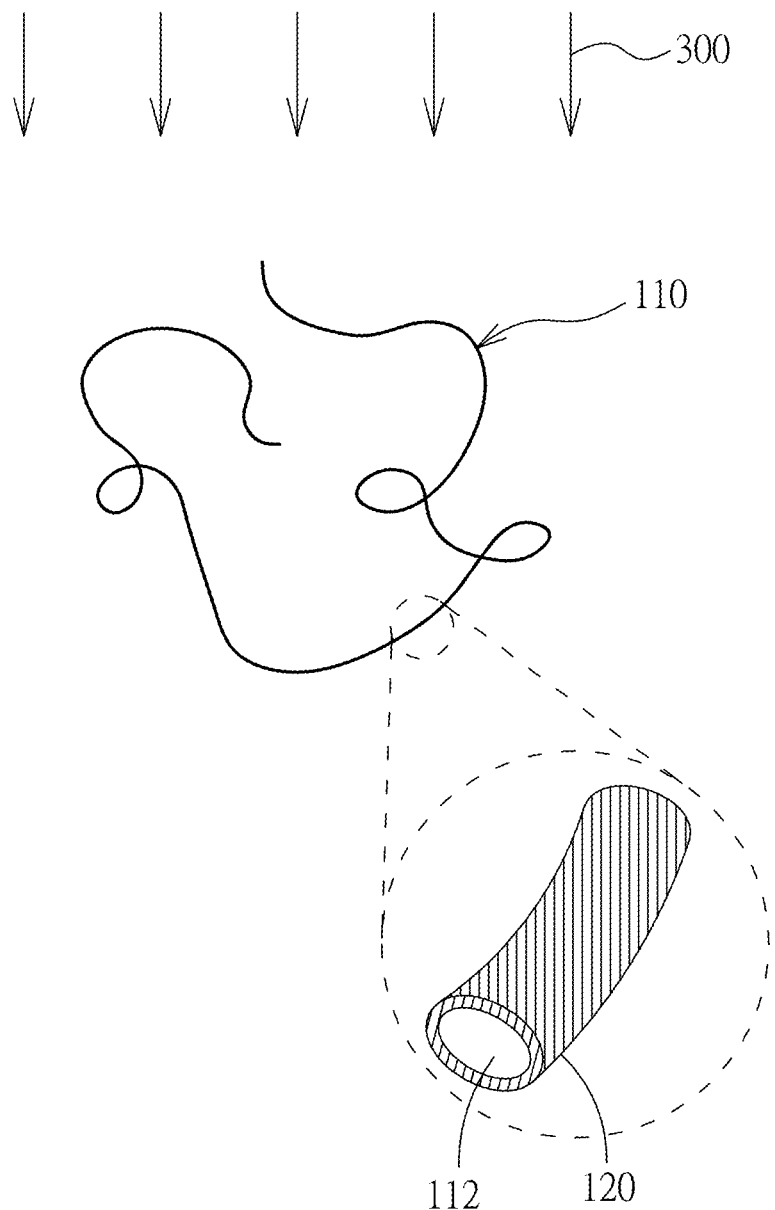
FIG. 3 is a schematic diagram of a core-sheath fiber when a cleaning process is completed in accordance with one embodiment of the present invention

In the following processes, processes similar to the plasma treatment process 200 and the cleaning process 300 disclosed in the embodiments of FIG. 2 and FIG. 3 may be applied to the polymer fibers 660 and 710. When the processes are completed, a continuous metal membrane may be formed on the surface layer of the polymer fibers 660 and 710. For the polymer fiber 660 fabricated by the coaxial electrospinning process, all the polymer in the sheath 664 is preferably etched away completely during the plasma treatment process, and all the metal precursor 66 in the sheath 664 is preferably reduced to metal completely which constitutes the metal membrane surrounding the core 662.

Figure 11:
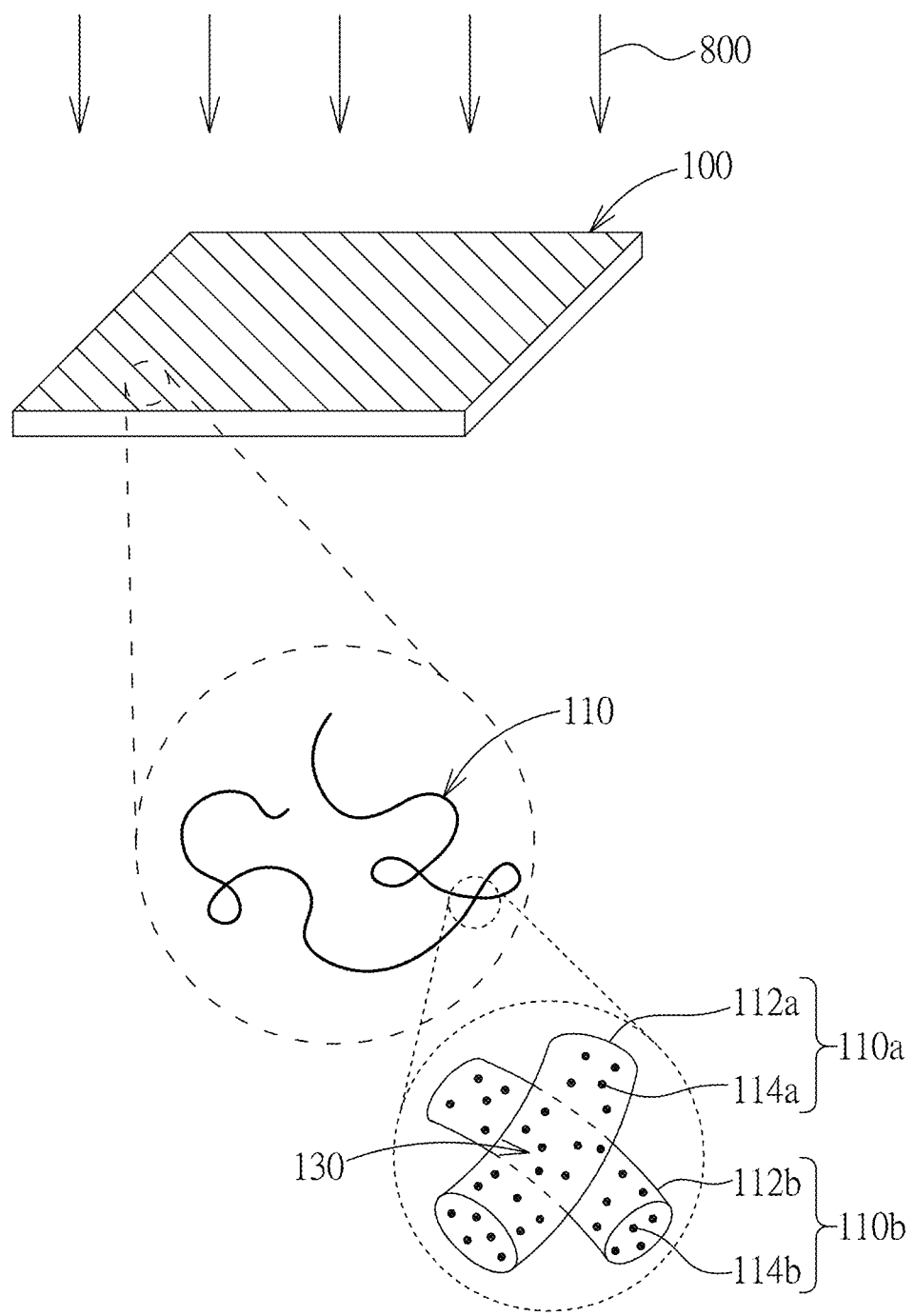
FIG. 11 is a schematic diagram of applying a pressing process to a fibrous web structure in accordance with one embodiment of the present invention.

FIG. 11 is a schematic diagram of applying a pressing process to a fibrous web structure in accordance with one embodiment of the present invention. According to another embodiment of the present invention, after forming the polymer fiber 110 and before conducting the plasma treatment process 200, a pressing process 800 may be applied to the fibrous web structure 100 when the solvent in the polymer fiber 110 is not completely volatilized. The pressing process 800 may be conducted at a pressure of 0.1 MPa for a period of time, such as 30 minutes. The segments 110a and 110b of the polymer fiber 110 may already be stacked with each other in an overlapping region 130 before conducting the pressing process 800. During the pressing process 800, the segments 110a and 110b of the polymer fiber 110 in the overlapping region 130 may contact with each other more tightly. In the subsequent plasma treatment process, the polymer 112a and 112b respectively in the surface layer of the segment 110a and 110b may be etched gradually, and the metal precursor 114a and 114b may be reduced to the metal membrane surrounding the surface layer of the polymer 112a and 112b. Besides, the metal membranes respectively on the surface layer of the segment 110a, 110b may constitute a continuous membrane instead of two independent metal membranes. The sheet resistance of the fibrous web structure 100 processed by the pressing process may 10 times less than that of the fibrous web structure 100 without the pressing process.

The fibrous web structures fabricated in the embodiments describe above may be further processed by a patterning process so as to form a conductive feature pattern made of geometric features having desired shapes in the fibrous web structure. When the plasma treatment process is completed, a patterned fibrous web structure having a treated region and an untreated region is obtained. The treated region is a conductive region, and the untreated region is a non-conductive region. The patterning process is disclosed in detail in the following paragraphs.

Figure 12:
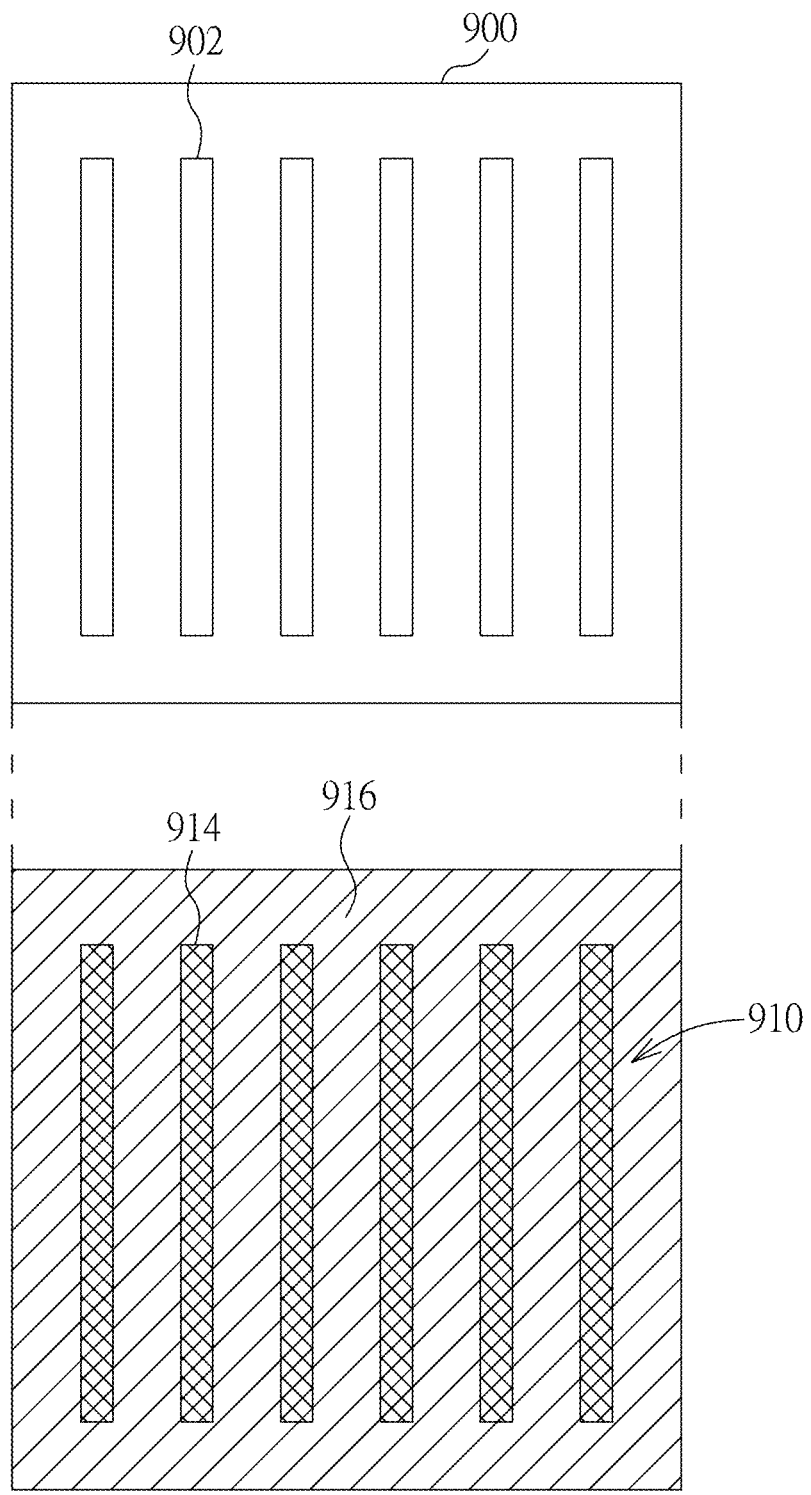
FIG. 12 is a schematic diagram of a conductive feature pattern defined in a fibrous web structure in accordance with one embodiment of the present invention.

FIG. 12 is a schematic diagram of a conductive feature pattern defined in a fibrous web structure in accordance with one embodiment of the present invention. According to the present embodiment, instead of immediately conducting the plasma treatment process, a pattered mask 900 is disposed on the surface of the fibrous web structure 910 after forming the fibrous web structure 910. There may be numerous holes 902 having identical or different shapes in the pattered mask 900. The holes 902 may be arranged to constitute a feature pattern. When the patterned mask 900 is disposed on the fibrous web structure 910, only the fibrous web structure 910 directly under the holes 902 may be exposed, while other portions of the fibrous web structure 910 are completely covered by the patterned mask 900. Then, a process similar to the plasma treatment process 200 disclosed in the embodiment of FIG. 2 may be conducted. During the plasma treatment process, the metal precursors directly under the holes 902 may be reduced to metal so as to constitute a conductive region 914 having a desired pattern, also called a conductive pattern, in the fibrous web structure 910. In contrast, the metal precursor not directly under the holes 902 may not be reduced to metal and may constitute a non-conductive region 916 in the fibrous web structure 910. The patterned mask 900 may be further removed after the plasma treatment process. By applying the processes described above, the feature patterns of the patterned mask 900 may be used to define the conductive patterns in the fibrous web structure 910. Preferably, the size and shape of the feature pattern is identical to the size and shape of the conductive pattern.

Figure 13:
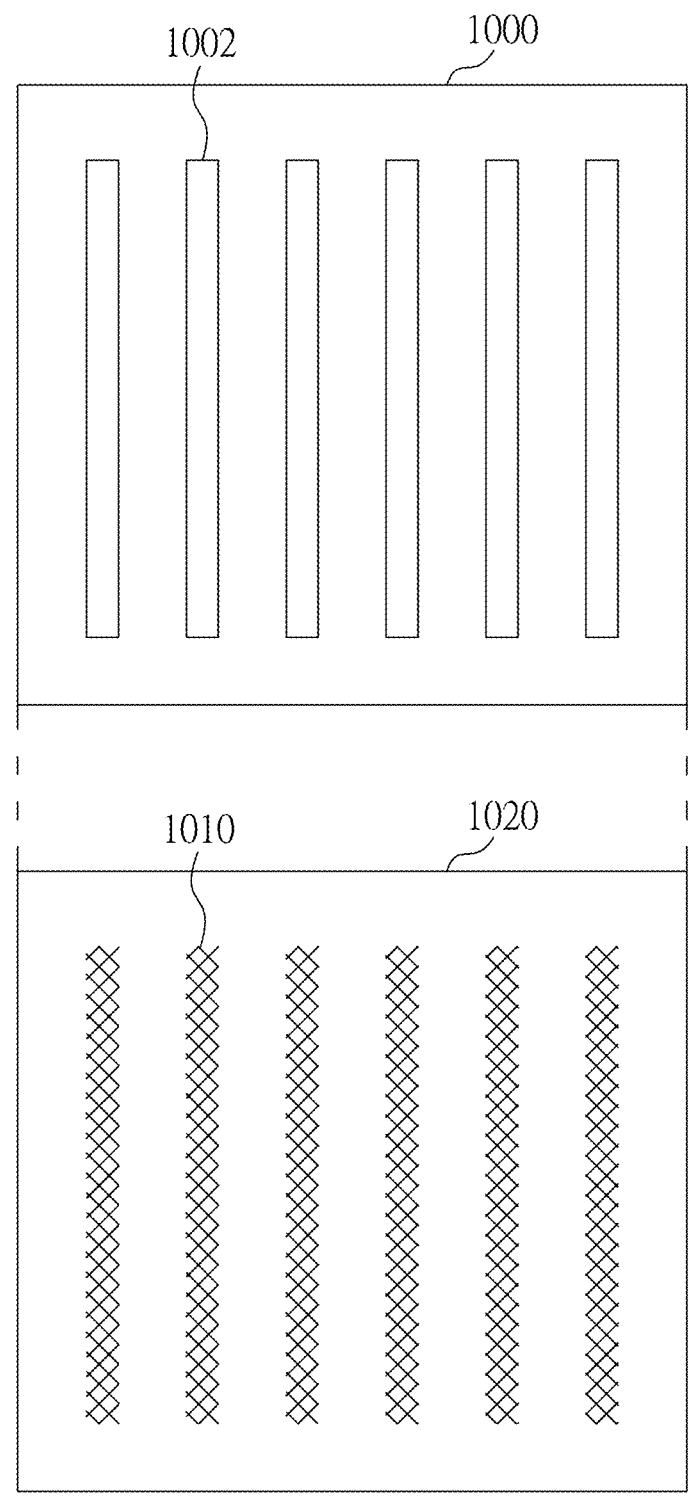
FIG. 13 is a schematic diagram of a conductive feature pattern defined in a fibrous web structure in accordance with one embodiment of the present invention.

FIG. 13 is a schematic diagram of a conductive feature pattern defined in a fibrous web structure in accordance with one embodiment of the present invention. According to the present embodiment, a pattered mask 1000 is disposed on a substrate 1020 before applying an electrospinning process. There may be numerous holes 1002 having identical or different shapes in the pattered mask 1000. The holes 1002 may be arranged to constitute a feature pattern. Afterwards, an electrospinning process is conducted to fabricate an electrospun polymer fiber which constitutes a fibrous web structure 1010. Portions of the fibrous web structure 1010 may cover the top surface of the patterned mask 1000, while portions of the fibrous web structure 1010 may be filled into the holes 1002 to directly contact the substrate 1020 directly under the hole 1002. Afterwards, the patterned mask 1000 along with the fibrous web structure 1010 on the top of it is removed to leave a patterned fibrous web structure 1010 on the substrate 1020. Then, a process similar to the plasma treatment process 200 disclosed in the embodiment of FIG. 2 may be conducted. During the plasma treatment process, the metal precursors in the patterned fibrous web structure 1010 may be reduced to metal so as to constitute a conductive pattern. Preferably, the size and shape of the feature pattern is identical to the size and shape of the conductive pattern.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a conductive thin film, comprising:
    forming a polymer fiber, wherein a composition of the polymer fiber comprises a polymer and at least a metal precursor, the metal precursor is distributed in a surface layer of the polymer fiber; and
    applying a plasma treatment on the polymer fiber to concurrently etch the polymer and reduce the metal precursor in the surface layer of the polymer fiber, whereby a metal membrane is formed on the surface of the polymer fiber.

2. The method of fabricating the conductive thin film of claim 1, wherein the to step of forming the polymer fiber comprises:
    forming an electrospun fiber; and
    diffusing the metal precursor into the electrospun fiber.

3. The method of fabricating the conductive thin film of claim 1, the method further comprising preparing a solution before the step of forming the polymer fiber, wherein a composition of the solution comprises the polymer, an organic solvent, and the metal precursor, and the step of forming the polymer fiber comprises:
    elecrospinning the solution so as to form the polymer fiber on a substrate, wherein the metal precursor is distributed in the polymer fiber.

4. The method of fabricating the conductive thin film of claim 1, wherein the polymer is a homopolymer or a copolymer, and the polymer comprises a acrylic polymer, a vinyl polymer, a polyester or a polyamide.

5. The method of fabricating the conductive thin film of claim 3, wherein the metal precursor is a metal salt, a metal halide, a organic metal compound, or an metallic nanoparticle encapsulated in protection agents, a weight percent of the metal precursor in the solution ranging from 5 wt % to 25 wt % based on the total weight of the solution.

6. The method of fabricating the conductive thin film of claim 3, wherein an electric field applied to the solution ranges from 0.2 kV/cm to 6 kV/cm during the step of electrospinning the solution.

7. The method of fabricating the conductive thin film of claim 3, wherein segments of the polymer fiber are stacked over one another to constitute a fibrous web structure, and the method of fabricating the conductive thin film further comprises:
    applying a pressing process to the fibrous web structure before the step of applying the plasma treatment so as to enlarge a contact area between the segments of the polymer fiber.

8. The method of fabricating the conductive thin film of claim 3, wherein the method further comprises removing the organic solvent remaining in the polymer fiber before the step of applying the plasma treatment.

9. The method of fabricating the conductive thin film of claim 1, wherein a ratio of an etch rate of the metal membrane to an etch rate of the polymer is between 0~0.01 during the step of applying the plasma treatment.

10. The method of fabricating the conductive thin film of claim 1, wherein the plasma treatment comprises an inert gas plasma treatment, an air plasma treatment, an oxygen plasma, and/or a hydrogen plasma treatment.

11. The method of fabricating the conductive thin film of claim 1, wherein the surface layer of the polymer fiber is surrounded by the metal membrane when the plasma treatment is completed, and the polymer fiber and the metal membrane constitute a core-sheath structure.

12. The method of fabricating the conductive thin film of claim 1, wherein the method further comprises removing the metal precursor remaining in the polymer fiber after the step of applying the plasma treatment.

13. The method of fabricating the conductive thin film of claim 3, wherein the polymer is poly(methyl methacrylate), the organic solvent is a mixture of butanone and methanol, the metal precursor is silver trifluoroacetate, a weight percent of poly(methyl methacrylate) in the solution ranges from 10~20 wt % based on the total weight of the solution, and a weight ratio of silver trifluoroacetate to poly(methyl methacrylate) is 0.2~1.5.

14. The method of fabricating the conductive thin film of claim 3, wherein the polymer is polyethylene terephthalate, the organic solvent is a mixture of trifluoroacetic acid and dichloromethane, the metal precursor is silver trifluoroacetate, a weight percent of polyethylene terephthalate in the solution ranges from 5~20 wt % based on the total weight of the solution, and a weight ratio of silver trifluoroacetate to polyethylene terephthalate is 0.2~1.5.

15. The method of fabricating the conductive thin film of claim 1, wherein segments of the polymer fiber are stacked over one another to constitute a fibrous web structure, and the method of fabricating the conductive thin film further comprises:
    forming a patterned mask covering the surface of the fibrous web structure before applying the plasma treatment; and
    removing the patterned mask after applying the plasma treatment.

16. The method of fabricating the conductive thin film of claim 15, wherein the patterned mask comprises a feature pattern, and the fibrous web structure comprises a conductive pattern when the plasma treatment is completed, the arrangement of the feature pattern is identical to the arrangement of the conductive pattern.

17. The method of fabricating the conductive thin film of claim 1, wherein segments of the polymer fiber are stacked over one another to constitute a fibrous web structure, and the method of fabricating the conductive thin film further comprises:
    forming a patterned fibrous web structure by pattering the fibrous web structure during the step of applying plasma treatment, the patterned fibrous web structure comprises a treated region and an untreated region, wherein the treated region is a conductive region, and the untreated region is a non-conductive region.

18. The method of fabricating the conductive thin film of claim 1, wherein the step of forming the polymer fiber comprises:
    providing a patterned mask having at least a hole; and
    forming the polymer fiber in the hole.

19. The method of fabricating the conductive thin film of claim 3, wherein the step of electrospinning the solution is a coaxial electrospinning process, and the method of fabricating the conductive thin film further comprises:
  preparing a polymer solution, wherein a composition of the polymer solution comprises a further polymer;
  performing the coaxial electrospinning process by using the solution and the polymer solution so as to form the polymer fiber on the substrate, wherein the polymer fiber comprises a core and a sheath, a composition of the core comprises the further polymer, and a composition of the sheath comprises the polymer and the metal precursor; and
  applying the plasma treatment process to form the metal membrane surrounding the core.

20. The method of fabricating the conductive thin film of claim 1, wherein the step of forming the polymer fiber comprises an electrospinning process, an electrospray process, a melt blown process, a flash spinning process or an electrostatic melt blown process.

\* \* \* \* \*